United States Patent
Sutcliffe et al.

(10) Patent No.: US 7,754,137 B2
(45) Date of Patent: Jul. 13, 2010

(54) PROCESS FOR FABRICATING A COMPOSITE

(75) Inventors: Christopher Sutcliffe, Liverpool (GB); Paul Raymond Chalker, Wirral (GB)

(73) Assignee: The University of Liverpool, Liverpool (GB)

( * ) Notice: Subject to any disclaimer, the term of this patent is extended or adjusted under 35 U.S.C. 154(b) by 80 days.

(21) Appl. No.: 11/921,196

(22) PCT Filed: Jun. 5, 2006

(86) PCT No.: PCT/GB2006/002055

§ 371 (c)(1), (2), (4) Date: Mar. 3, 2008

(87) PCT Pub. No.: WO2006/131716

PCT Pub. Date: Dec. 14, 2006

(65) Prior Publication Data

US 2009/0117403 A1    May 7, 2009

(30) Foreign Application Priority Data

Jun. 6, 2005 (GB) ................... 0511460.8
Dec. 12, 2005 (GB) ................... 0525212.7

(51) Int. Cl.
*B29C 35/08* (2006.01)
*C23C 14/30* (2006.01)

(52) U.S. Cl. ...................... 264/497; 427/596
(58) Field of Classification Search ............ 264/497; 427/596
See application file for complete search history.

(56) References Cited

U.S. PATENT DOCUMENTS

| 4,474,861 | A | 10/1984 | Ecer |
| 5,749,041 | A | 5/1998 | Lakshminarayan et al. |
| 6,531,191 | B1 * | 3/2003 | Notenboom ............ 427/554 |
| 6,723,278 | B1 | 4/2004 | Lu et al. |
| 2003/0028278 | A1 | 2/2003 | Darrah et al. |
| 2004/0099983 | A1 | 5/2004 | Dirscherl |
| 2004/0146738 | A1 | 7/2004 | Claus et al. |
| 2004/0184700 | A1 | 9/2004 | Li et al. |
| 2006/0159896 | A1 * | 7/2006 | Pfeifer et al. ............ 428/206 |

FOREIGN PATENT DOCUMENTS

| EP | 0514351 | 11/1992 |
| EP | 0538244 | 4/1993 |
| EP | 1418013 | 5/2004 |

(Continued)

OTHER PUBLICATIONS

Ehsan Toyserkani, Amir Khajepour and Stephen Corbin "Laser Cladding" CRC Press, 2005, Chapter 1, pp. 1-23.

(Continued)

*Primary Examiner*—Kat Wyrozebski
*Assistant Examiner*—Robert J Grun
(74) *Attorney, Agent, or Firm*—Harness, Dickey & Pierce, P.L.C.

(57) ABSTRACT

The present invention relates to a process for fabricating a composite functional body/substrate, either by melting with an energy beam or by spin coating. The functional material is preferably a piezoelectric material (PVDF). The energy beam is preferably a laser beam.

33 Claims, 6 Drawing Sheets

FOREIGN PATENT DOCUMENTS

| | | |
|---|---|---|
| EP | 1419836 A1 | 5/2004 |
| WO | WO 98/24574 | 6/1998 |
| WO | WO-01/45882 | 6/2001 |
| WO | WO 03/106146 A1 * | 12/2003 |
| WO | WO 2004/108398 | 12/2004 |

OTHER PUBLICATIONS

Olivier Dufaud et al.: "Stereolithography of lead zirconate titanate ceramics for MEMS applications" 2003, Proc SPIE Int Soc Opt Eng; Proceedings of SPIE—The International Society for Optical Engineering 2003, vol. 5116 I, pp. 28-37, XP002392391 abstract.

* cited by examiner

PROCESS FOR FABRICATING A COMPOSITE

CROSS-REFERENCE TO RELATED APPLICATIONS

This application is a U.S. National Stage Application of International Application No. PCT/GB2006/002055, filed on Jun. 5, 2006 and published in English as WO 2006/131716 A2 on Dec. 14, 2006. This application claims the benefit of GB Application No. 0511460.8, filed on Jun. 6, 2005, and 0525212.7, filed on Dec. 12, 2005. The disclosures of the above applications are incorporated herein by reference.

The present invention relates to a process for fabricating a composite functional body/substrate.

The advent of silicon-based micro-electromechanical systems (MEMS) was largely born out of processes developed for manufacturing essentially two-dimensional (2D) integrated circuits. In order to extend MEM technologies to three-dimensional (3D) applications such as microfluidic valves, inkjet nozzles, projector micro-mirrors, high aspect ratio patterning techniques were developed such as 'LIGA' or X-ray photoresist processing [see for example M. J. Madou, Chapter 6 in "Fundamentals of Microfabrication", CRC Press, Boca Raton, Fla. 1997].

Selective laser melting (SLM) is a process conventionally deployed for the manufacture of complex three-dimensional components from metallic, ceramic or polymeric powder feedstock. The process has been used to manufacture complex components exhibiting high density and homogeneity such as tooling dies and medical implants (see for example EP-A-1418013).

The present invention is based on the recognition that selective melting may be deployed in fabricating heterogenous composites. More particularly, the present invention relates to an improved process for fabricating a composite functional body/substrate by selective melting using a directed energy beam.

Thus viewed from one aspect the present invention provides a process for fabricating a composite functional body/substrate comprising:

localising a build of a functional material capable of being melted by a directed energy beam onto a substrate;

selectively melting the build of functional material with the directed energy beam; and allowing the melted functional material to form the functional body of the composite functional body/substrate.

The process of the invention advantageously opens new avenues to the manufacture of 'smart' micro-machines and mechanisms for use in micro-systems and lab-on-a-chip technologies. The process of the invention is advantageous in fabricating composite functional body/substrates for example for the aerospace or automotive industry in which the functional body is a heat exchanger or a smart material or for the electronics industry in which the functional body is a cooling/heat exchanger.

The directed energy beam may be a laser beam or E-beam. Preferred is a laser beam and the step of selective melting is a step of selective laser melting (SLM).

Preferably the composite functional body/substrate is a part or multi-layer composite (eg a sandwich layer composite). The substrate may be a substrate layer. The functional body may be a functional layer. Alternatively the functional body may be three-dimensional (eg columnar or pillar-like or a complex 3D structure or build). The build of functional material may be a layer of functional material. Adjacent layers may be interleaved with binding layers.

The composite functional body/substrate may comprise integral parts, devices or structures. The integral parts, devices or structures may be layered or three-dimensional. The integral parts, devices or structures may be functional.

Preferably the composite functional body/substrate is a three-dimensional composite, particularly preferably a high aspect ratio three-dimensional composite. A typical aspect ratio (width of the composite or composite dimension in X-Y divided by the height from the base) is in excess of 1000 which is not achievable by conventional processes which are projection based and produce 2.5D composites.

The substrate may be a dielectric. The substrate may be a semiconductor. The substrate may be an electronic substrate. The electronic substrate may comprise one or more electronic parts, devices or structures. For example, the electronic substrate may be a printed wiring board on which electronic components are mounted or a semiconductor die on which electronic devices are manufactured.

In the process of the invention, the substrate may be or contain silicon and/or silicon dioxide. Typically the substrate is or contains silicon. The substrate may include an insulator layer (eg a silicon dioxide insulating layer). For example, in the process of the invention a silicon layer may be subjected to oxidation (eg thermal oxidation) to produce a silicon dioxide insulating layer. The substrate may be a wafer.

Preferably the substrate is metallised with a metal contact layer (eg with a nickel, titanium or aluminium contact layer such as an aluminium thin film contact layer). For example, the process of the invention may further comprise metallising the substrate with an aluminium contact layer (eg with an aluminium thin film contact layer). The process may further comprise patterning the aluminium contact layer. Patterning may be carried out by a wet etch process.

The functional body may be a body with a desirable electrical, magnetic, mechanical, optical or thermal property. For example, the functional body may be piezoelectric or auxetic or exhibit shape memory. In this context, the composite functional body/substrate is useful in the electronics field as an actuator. Preferably the functional material is capable of converting a first energy type into a second energy type. Particularly preferably the first energy type or the second energy type is electrical energy. Particularly preferably the first energy type or the second energy type is mechanical energy. Alternatively the functional body may be catalytically active.

In a particularly preferred embodiment, the functional body is a piezoelectric body (eg a polymeric piezoelectric body or a ceramic piezoelectric body). The piezoelectric body may be composed of a lead-containing material (eg a lead ceramic such as a lead zirconium titanate ceramic), quartz or polymer (eg a polyvinyl halide). Specific examples are lead titanate, lead zirconium titanate (PZT), lead zirconium lanthante, lead metaniobate, polyvinylidene fluoride (PVDF) or barium titanate. Preferred is a piezoelectric material selected from the group consisting of PVDF ($d_{33}$ about 23 pm/V [see IEEE 5th International Symposium on Micro Machine and Human Science Proceedings, Nagoya, October 1994, p. 75]), PZT ($d_{33}$ about 250-300 pm/V) and BaTiO$_3$ ($d_{33}$ about 150 pm/V).

In a particularly preferred embodiment, the functional body exhibits shape memory. For example, the functional body may be composed of a shape memory alloy. The shape memory alloy may be a titanium-nickel alloy (eg a 50:50 Ti:Ni alloy such as NITINOL).

In a particularly preferred embodiment, the functional body is an auxetic body.

In a particularly preferred embodiment, the functional body is catalytically active. For example, the functional body may be composed of a chemically functionalised or doped material.

The functional body may have a uniform or non-uniform identity. For example, the functional body may have a plurality of integral discrete elements. The functional body may have uniform or non-uniform physical or chemical properties. The functional body may be non-uniformly or uniformly insulative thermally or electrically. Preferably the functional body is uniformly or non-uniformly conductive thermally or electrically.

The functional body may have a plurality of integral discrete elements with different characteristics (eg different chemical or physical characteristics) or properties (eg chemical or physical properties). For example, the functional body may have a first integral discrete element which is electrically or thermally conductive and a second integral discrete element which is electrically or thermally insulative.

In a preferred embodiment, the functional body is capable of thermal management. In a particularly preferred embodiment, the functional body is capable of thermal management and the substrate is an electronic substrate. The functional body capable of thermal management may be a heat spreading body which transfers heat away from the substrate (for example via diffusion) or a heat exchanger body that transfers heat to a coolant (eg a coolant fluid which may be passing through, over or near to the functional body). Advantages of the embodiment of the process of the invention for fabricating a composite in which the functional body is capable of thermal management over existing processes for fabricating arrangements with thermal management properties include the minimisation of waste compared with machining from a single block of material, the feasibility of heat spreader/exchangers not feasible by selective removal manufacturing methods (eg channels) and the integration of external thermal management systems with integral elements of an electronic substrate eg thermal vias or heat management layers.

The functional material capable of being melted by a directed energy beam is typically a solid. Preferably the functional material capable of being melted by a directed energy beam is particulate, particularly preferably powdered. The functional material capable of being melted by a directed energy beam may be elemental or non-elemental.

The functional material capable of being melted by a directed energy beam may be a thermoplastic.

Preferably the functional material capable of being melted by a directed energy beam is metal-containing. The metal-containing functional material may contain one or more metal species (eg elemental metal, metal compounds, metal composites, metal alloys, metal ceramics or organometallics). Preferred metal-containing functional materials are metal alloys (eg low melt alloys such as bronze and cobalt chrome), zinc, titanium, aluminium oxide, lead titanate, lead zirconium titanate (PZT), lead zirconium lanthante, lead metaniobate, barium titanate, cadmium sulphide and steel (eg stainless steel).

The functional material capable of being melted by a directed energy beam may be a non metal-containing functional material. A specific example of a non metal-containing functional material is silicon carbide.

Preferably the functional material is a functional material composition comprising a plurality of material components (eg powdered material components), at least one (preferably more than one, more preferably all) of which is a functional material component (eg a powdered functional material component). Particularly preferably the material components differ in at least one physical or chemical property. More preferably the functional material composition exhibits non-uniform behaviour on exposure to a directed energy beam (eg laser irradiation). For example, at least one material component exhibits different behaviour on exposure to a directed energy beam (eg laser irradiation) from another material component. By exhibiting differential behaviour on exposure to a directed energy beam (eg different thresholds to laser damage), it will be feasible using this embodiment of the process of the invention to fabricate a functional body with a selective identity (eg a uniform or non-uniform identity). For example a first material component may be a polymer and a second material component may be a metal. In this embodiment, a high laser power may volatilise the first material component leaving behind metal (ie the second material component) alone to form a uniform functional body. At a lower laser power, neither material component is volatised and a non-uniform (ie metal-plastic) functional body may be formed. This may be advantageous for example in fabricating electrically insulating and conducting elements within the functional body.

In a preferred embodiment, the functional material is a piezoelectric material (eg a polymeric piezoelectric material or a ceramic piezoelectric material). The piezoelectric material may be a lead-containing material (eg a lead ceramic such as a lead zirconium titanate ceramic), quartz or polymer (eg a polyvinyl halide). Specific examples are lead titanate, lead zirconium titanate (PZT), lead zirconium lanthante, lead metaniobate, polyvinylidene fluoride (PVDF) or barium titanate. Preferred is a piezoelectric material selected from the group consisting of PVDF ($d_{33}$ about 23 pm/V [see IEEE 5th International Symposium on Micro Machine and Human Science Proceedings, Nagoya, October 1994, p. 75]), PZT ($d_{33}$ about 250-300 pm/V) and BaTiO$_3$ ($d_{33}$ about 150 pm/V).

In a preferred embodiment, the functional material may exhibit shape memory. For example, the functional material may be a shape memory alloy. The shape memory alloy may be a titanium-nickel alloy (eg a 50:50 Ti:Ni alloy such as NITINOL).

In a preferred embodiment, the functional material may be auxetic.

In a preferred embodiment, the functional material may be catalytically active. For example, the functional material may be chemically functionalised or doped.

In the process of the invention, localising the functional material onto the substrate may bring them into close proximity or into contact. For example, the functional material may be applied to (eg coated or spread onto) the surface of the substrate.

Preferably the substrate is provided (eg coated) with an interfacial material. Preferably the process further comprises:

applying an interfacial material to the substrate before localising the substrate with the functional material.

An interfacial material can usefully promote adhesion of the functional body. An interfacial material can usefully prevent damage to the substrate. The interfacial material can advantageously promote heat transfer which is particularly usefully exploited where the functional body is capable of thermal management and the substrate is an electronic substrate.

Preferably the interfacial material is a metal-containing material. For example the interfacial material may be a metal-containing layer such as a metal-containing film (eg a metallic film). The metal-containing interfacial material may contain one or more metal species (eg elemental metal, metal compounds, metal composites, metal alloys, metal ceramics or organometallics). Preferably the metal species is a transition metal species.

Preferably the metal-containing interfacial material is capable of adhering to the substrate and to the functional body. Preferably the metal-containing interfacial material has a low thermal resistance. Preferably the metal-containing interfacial material is capable of passivation to minimise directed energy beam (eg laser) reflection.

Preferred metal-containing interfacial materials are elements or alloys (eg transition metal alloys or elements). Particularly preferred metal-containing interfacial materials are Ti, Cr, Ni and stainless steel. Other metal-containing interfacial materials may be suitable depending on the nature of the functional material. The metal-containing interfacial material may be applied to the substrate by vapour deposition, plasma spraying, spin coating, cold gas dynamic spraying or selective laser melting.

In the step of selective melting, the substrate and build of functional material may be static or in motion (eg in rotary motion). In the step of selective melting, the directed energy beam may be static or in motion. Preferably the substrate and build of functional material is rotated and the source of the directed energy beam (eg laser) is moved radially to-and-fro. This advantageously produces a functional body with a spiral configuration defining paths which might usefully carry dissimilar fluids (eg coolants).

The functional body may be fabricated with channels, ducts, tracks or chambers for fluid. The functional body may be composed of a random, pseudo-random or regular lattice. The process of the invention may be software controlled to obtain the required lattice or to introduce channels, ducts, tracks or chambers.

The step of selective melting in the process of the invention is generally carried out in a substantially oxygen free environment (eg an argon environment).

Preferably the step of selective melting in the process of the invention is carried out such that the chemical characteristics of the functional material are substantially unaltered.

Typically the step of selective melting in the process of the invention is carried out using a conventional laser. For example, the laser may be an IR (eg a near-IR) laser. The laser is typically a tunable laser.

Typically the wavelength of the directed energy beam (eg laser) is 700 nm or more, preferably a wavelength in the range 700-5000 nm, particularly preferably a wavelength in the range 900-1200 nm, more preferably a wavelength in the range 1000-1100 nm. The step of selective melting may be carried out with an Ytterbium fibre laser, an E-beam Nd:YAG laser or a $CO_2$ laser. A specific example of a preferred laser is an Ytterbium fibre laser operable in the range 1068-1095 nm.

Preferably the step of selective melting in the process of the invention is carried out off-axis (ie at an angle to the substrate surface normal). This advantageously offsets deleterious back reflections.

Preferably the step of localising a build of a functional material onto a substrate comprises:

a plurality of sequential steps of localising the build of the functional material onto the substrate.

Preferably the step of selectively melting the build of functional material with a directed energy beam comprises:

a plurality of sequential steps of selectively melting the build of functional material with the directed energy beam.

Preferably the sequential steps of localising the build of the functional material onto the substrate alternate with the sequential steps of selectively melting the build of functional material with the directed energy beam whereby to progressively form the functional body.

The power output, current, exposure time and focusing parameters (eg beam spot size) of the source of the directed energy beam (eg laser) may be selected by the man skilled in the art according to requirements (eg to ensure that the chemical characteristics of the functional material are substantially unaltered).

Preferably the step of allowing the melted functional material to form the functional body of the composite functional body/substrate comprises cooling the melted functional material. This may occur naturally or by exposure to cooling means. The step of allowing the melted functional material to form the functional body of the composite functional body/substrate may cause adhesion.

The step of selective melting in the process of the invention may be conveniently carried out in a MCP Realizer commercially available from MCP Tolling Technologies (Stone UK) or systems manufactured by Triumph, EOS, Concept Laser GmbH and Arcam. A machine for carrying out the process of the invention is described in WO-A-2004/08398.

Preferably the substrate is provided (eg coated) with a functional thin film. In a preferred embodiment, the process further comprises before localising the substrate with the functional material:

applying a thin film material to the substrate to generate a functional thin film.

The thin film material may be as hereinbefore defined for the functional material. A preferred thin film material is a polyvinyl halide, particularly preferably PVDF.

Preferably the step of applying the thin film material to the substrate comprises:

coating (eg spin coating) the thin film material onto the substrate.

The functional thin film may be metallised with an aluminium contact pad (eg an aluminium thin film contact pad). The aluminium contact pad may be an aluminium contact pad layer. The process may further comprise patterning the aluminium contact pad. Patterning may be carried out by wet etching.

The process may further comprise patterning the functional thin film. Patterning may be carried out by dry etching (eg dry plasma etching). For this purpose, an aluminium contact pad applied in accordance with an embodiment of the invention described hereinbefore is a useful etching mask.

The functional thin film may be a few µm (eg 3-5 µm) thick.

The process may further comprise applying to the composite functional body/substrate carbon fibres or carbon composites. This may be carried out by bonding or ultrasonic consolidation.

Viewed from a further aspect the present invention provides a method for fabricating a composite PVDF thin film/substrate comprising:

adhering PVDF to the substrate to form the functional PVDF thin film of the composite PVDF thin film/substrate.

Preferably the step of adhering PVDF to the substrate comprises: coating (eg spin coating) PVDF onto the substrate.

The functional PVDF thin film may be a few µm (eg 3-5 µm) thick.

Preferably the method further comprises:

metallising the functional PVDF thin film with an aluminium contact pad (eg an aluminium thin film contact pad). The aluminium contact pad may be an aluminium contact pad layer. The method may further comprise patterning the aluminium contact pad. Patterning may be carried out by wet etching.

The method may further comprise patterning the functional PVDF thin film. Patterning may be carried out by dry etching (eg dry plasma etching). For this purpose, the aluminium contact pad is a useful etching mask.

In the method of the invention, the substrate may be composed of silicon and/or silicon dioxide. Typically the substrate is or contains silicon. The substrate may include an insulator layer (eg a silicon dioxide insulating layer). For example, in the method of the invention a silicon layer may be subjected to oxidation (eg thermal oxidation) to produce a silicon dioxide insulating layer. The substrate may be a wafer.

Preferably the substrate is metallised with an aluminium contact layer (eg with an aluminium thin film contact layer). For example, the method of the invention may further comprise metallising the substrate with an aluminium contact layer (eg with an aluminium thin film contact layer). The method may further comprise patterning the aluminium contact layer. Patterning may be carried out by a wet etch process. This embodiment advantageously may allow a composite PVDF thin film/substrate to be fabricated in which the functional PVDF thin film is sandwiched between the Al contact layer and the Al contact pad.

Viewed from a yet further aspect the present invention provides a composite functional body/substrate obtainable by a process as hereinbefore defined.

The composite functional body/substrate, functional body and substrate may be as hereinbefore defined.

Viewed from a still yet further aspect the present invention provides a composite PVDF thin film/substrate obtainable by a method as hereinbefore defined.

The composite PVDF thin film/substrate, PVDF thin film and substrate may be as hereinbefore defined.

In a preferred embodiment, the PVDF thin film is sandwiched between an aluminium contact layer and an aluminium contact pad.

The present invention will now be described in a non-limitative sense with reference to the examples and accompanying Figures in which.

Wafer Patterning

Figure 1A:
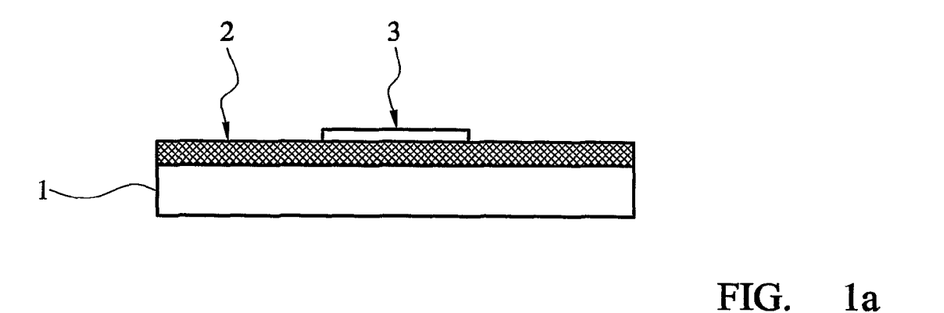
FIG. 1 is a schematic representation of an embodiment of the process of the invention.

A silicon wafer platform (see FIG. 1*a*) was processed using conventional clean room steps:

Si(100) wafers (1) with a $SiO_2$ insulating layer (2) grown thermally (10 hours at 1000° C.) were first metallized with a thin film of Al (500 nm) evaporated under vacuum to produce an Al contact layer (3)

a spin coated film of positive photoresist was patterned in the wafer with a 20 second UV exposure and developed the protected Al was patterned into the wafer using an 8:1:1 $HCl/H_2O_2/H_2O$ wet etch.

Selective Laser Melting

Figure 2:
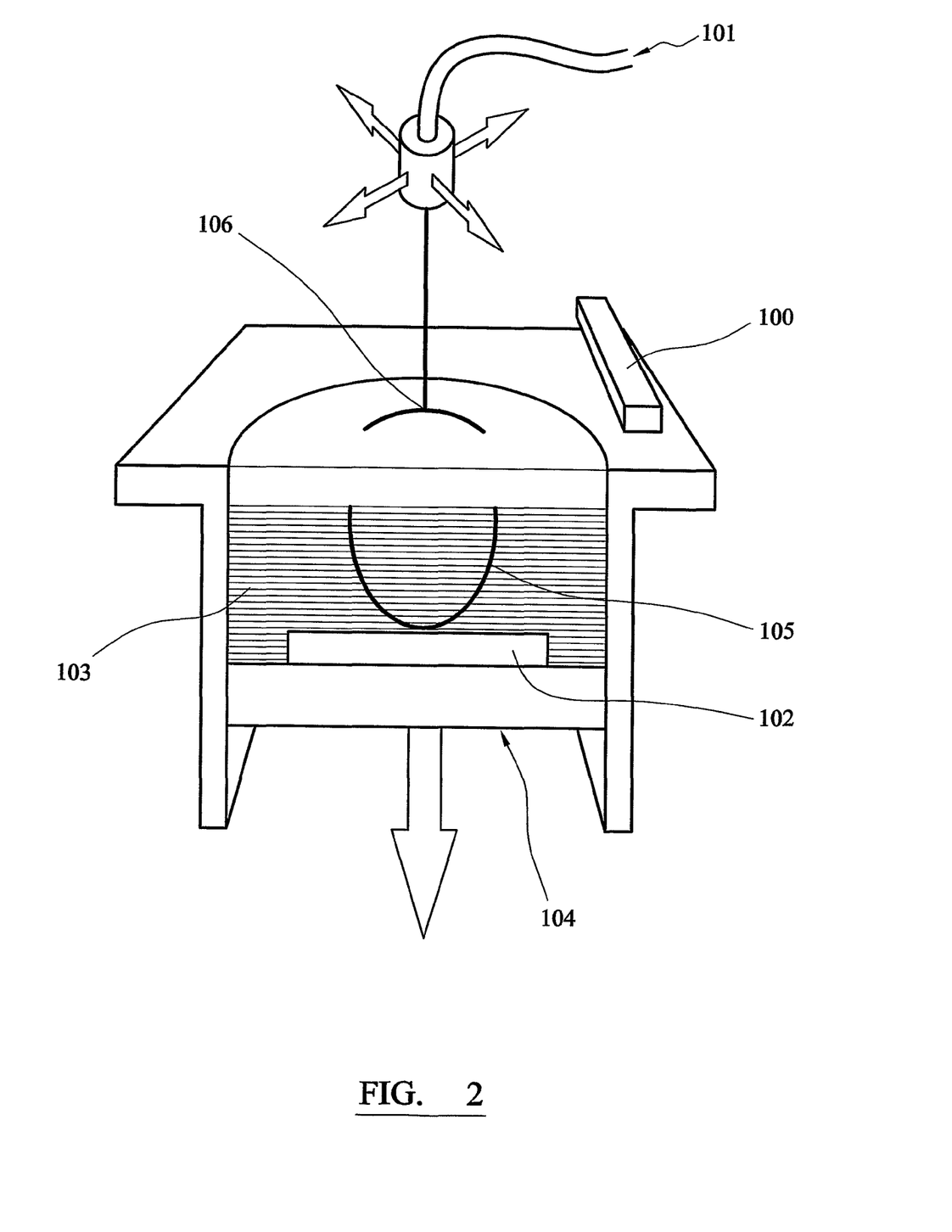
FIG. 2 is a schematic representation of an MCP Realizer for carrying out the process of the invention.

FIG. 2 is a schematic representation of an MCP Realizer and shows successive layers of powder 103 being deposited (the first layer being deposited onto the substrate 102) and spread uniformly by a wiper and powder deposition mechanism 100. For this purpose, a supporting table 104 supporting the substrate 102 drops down synchronously with the action of the wiper and powder deposition mechanism 100. A 100 W Ytterbium fibre laser (wavelength 1068-1095 nm) 101 melts the successive layers of powder 103 according to a specific computer generated pattern. Single component powder particles 106 are fully or partially melted by the laser beam as it draws the design over the successive layers of powder 103. Build thickness can be as high as 200 μm per pass. The molten material is then solidified and the resultant fabrication 105 is fully dense.

The variable focussing optics are Sill 300 mm focal length lenses, which produce a focussed beam spot size of 60 μm diameter at 80 watts power. Since the successive layers of powder 103 are subjected to melting during the process, protection of the SLM-processed parts from oxidation is imperative. Thus all powder processing occurs in an Argon atmosphere with no more than 0.2% $O_2$. The process was controlled using the proprietary control software Fusco.

EXAMPLE 1

Figure 4A:
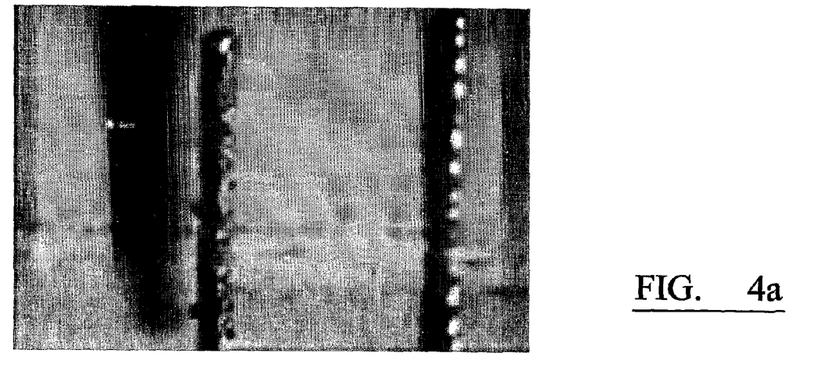
FIGS. 4*a-c* show optical micrographs of SLM steel bodies fabricated in accordance with an embodiment of the process of the invention.
Figure 4B:
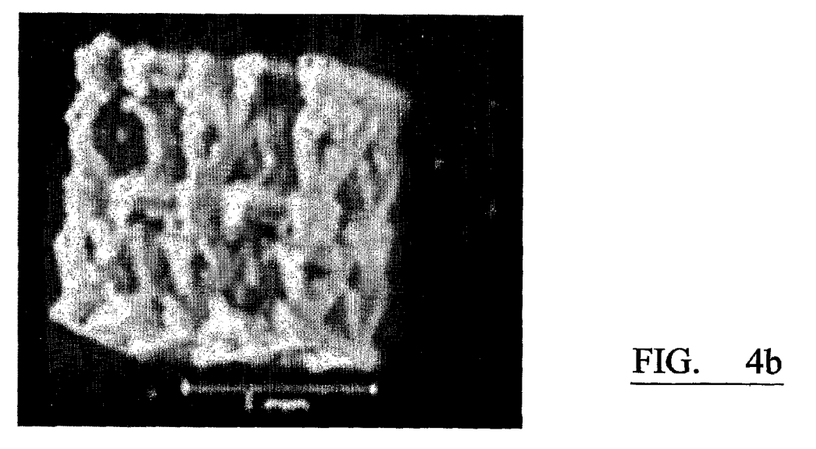
Figure 4C:
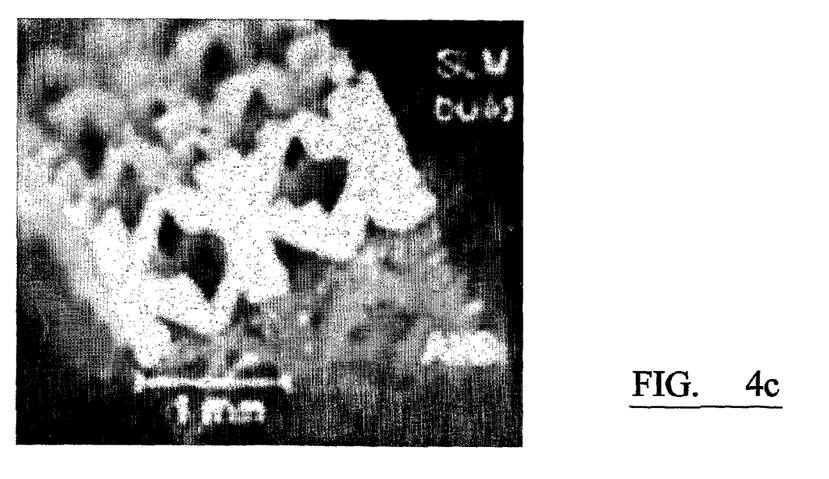
Figure 5:
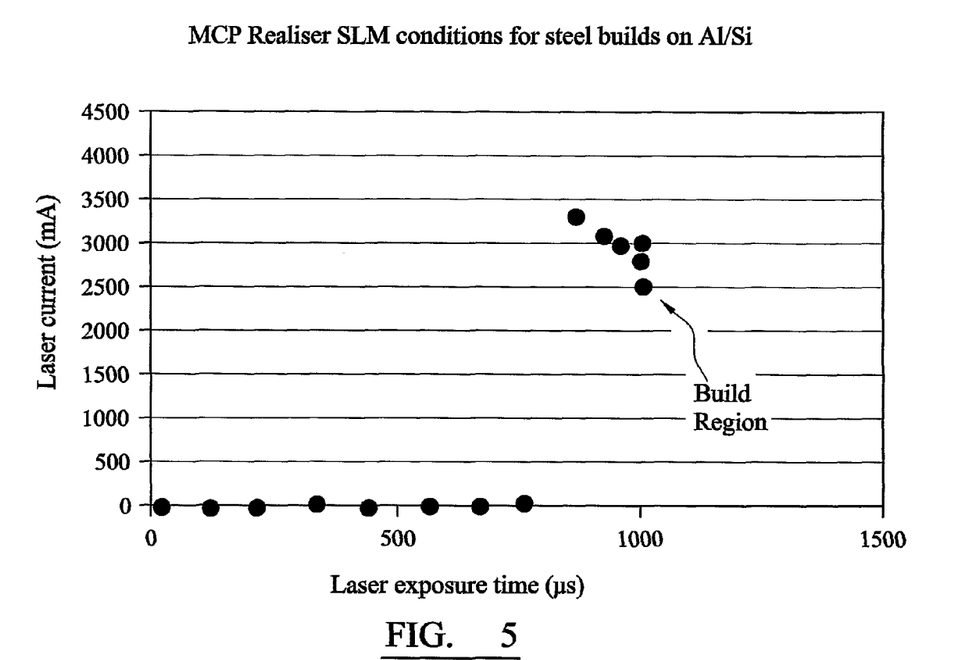
FIG. 5 illustrates the correlation between laser power, exposure time and laser optic focal length in an embodiment of the process of the invention.

High aspect ratio 3D SLM builds have been achieved on metallized Si (100) wafers (1) using steel powder having an average grain size of 50 μm. FIGS. 4*a-c* show optical micrographs of SLM steel bodies. In FIG. 4*a*, an array of steel pillars (see in particular figure inset) is shown. FIGS. 4*b* and 4*c* show a more complex body. The fabrication time for such a steel body is approximately 10 minutes. FIG. 5 illustrates the correlation between laser power, exposure time and laser optic focal length required for successful SLM steel builds onto the metallized Si substrate (1).

A successful SLM build on metallized Si (100) wafers requires the build to be performed "off axis" in the MCP Realizer ie where the builds are constructed at an angle to the laser optics/substrate surface normal. This is to offset "back reflection" encountered by the MCP laser optics when pulsing onto the highly reflective Si/Al surface.

EXAMPLE 2

Figure 3:
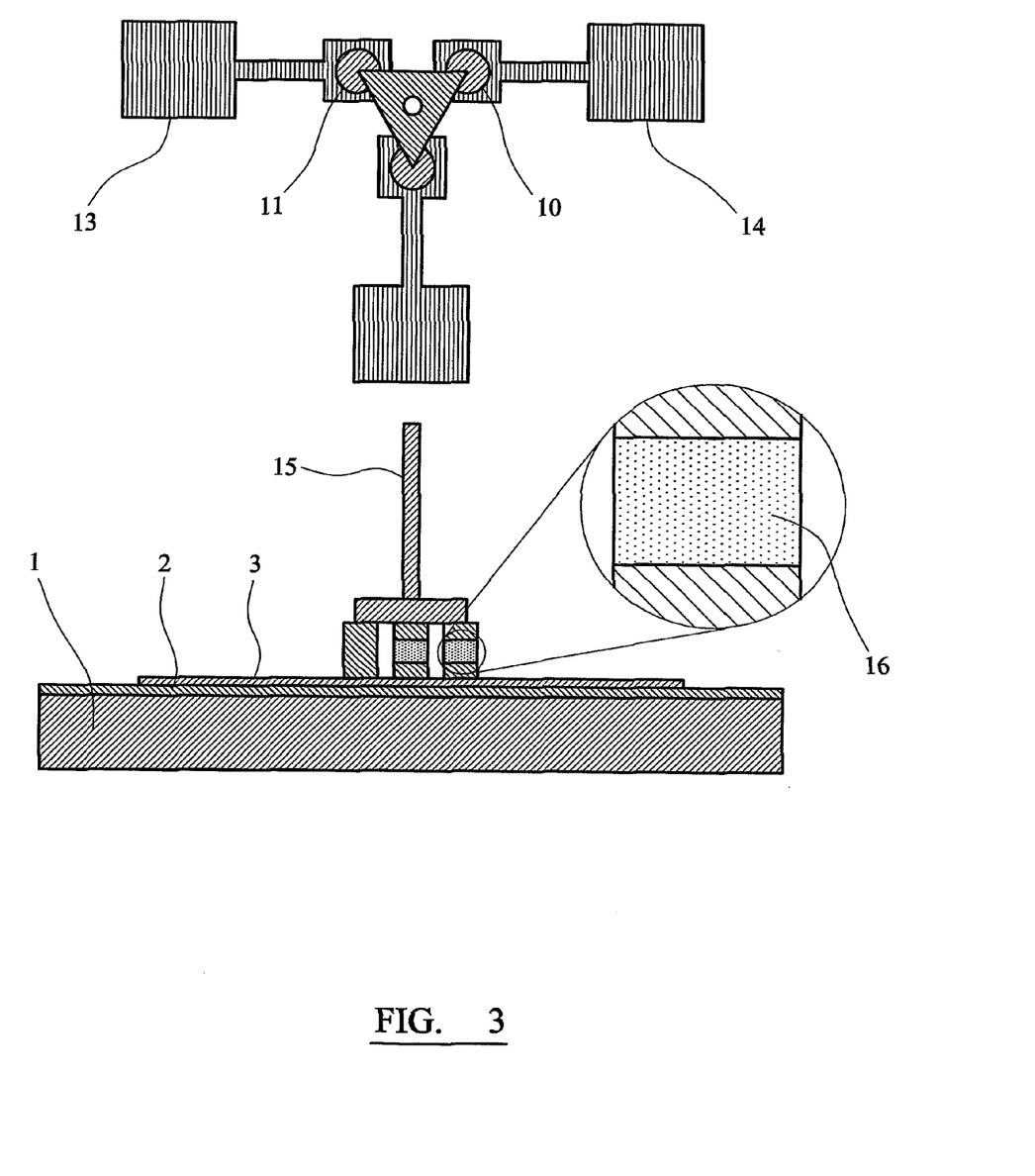
FIG. 3 is a schematic representation of a micro-positioner fabricated to determine the properties of the composite fabricated in accordance with an embodiment of the process of the invention.

In a second embodiment of the process of the invention, the use of polyvinylidene fluoride (PVDF—piezoelectric modulus, $d_{33}$~23 pm/V [see IEEE 5th International Symposium on Micro Machine and Human Science proceedings, Nagoya, October 1994, p. 75]) piezoelectric has been demonstrated. For this purpose, a micro-positioner (FIG. 3) was fabricated. The micro-positioner comprises generally twin actuators 10, a stationary leg 11 and electric earth/bias contacts 13/14. The twin actuators 10 consist of piezoelectric elements 16 produced by the embodiment of the process of the invention. When actuated, the movement of the deflection arm 15 can be established with a traveling microscope.

Figure 6:
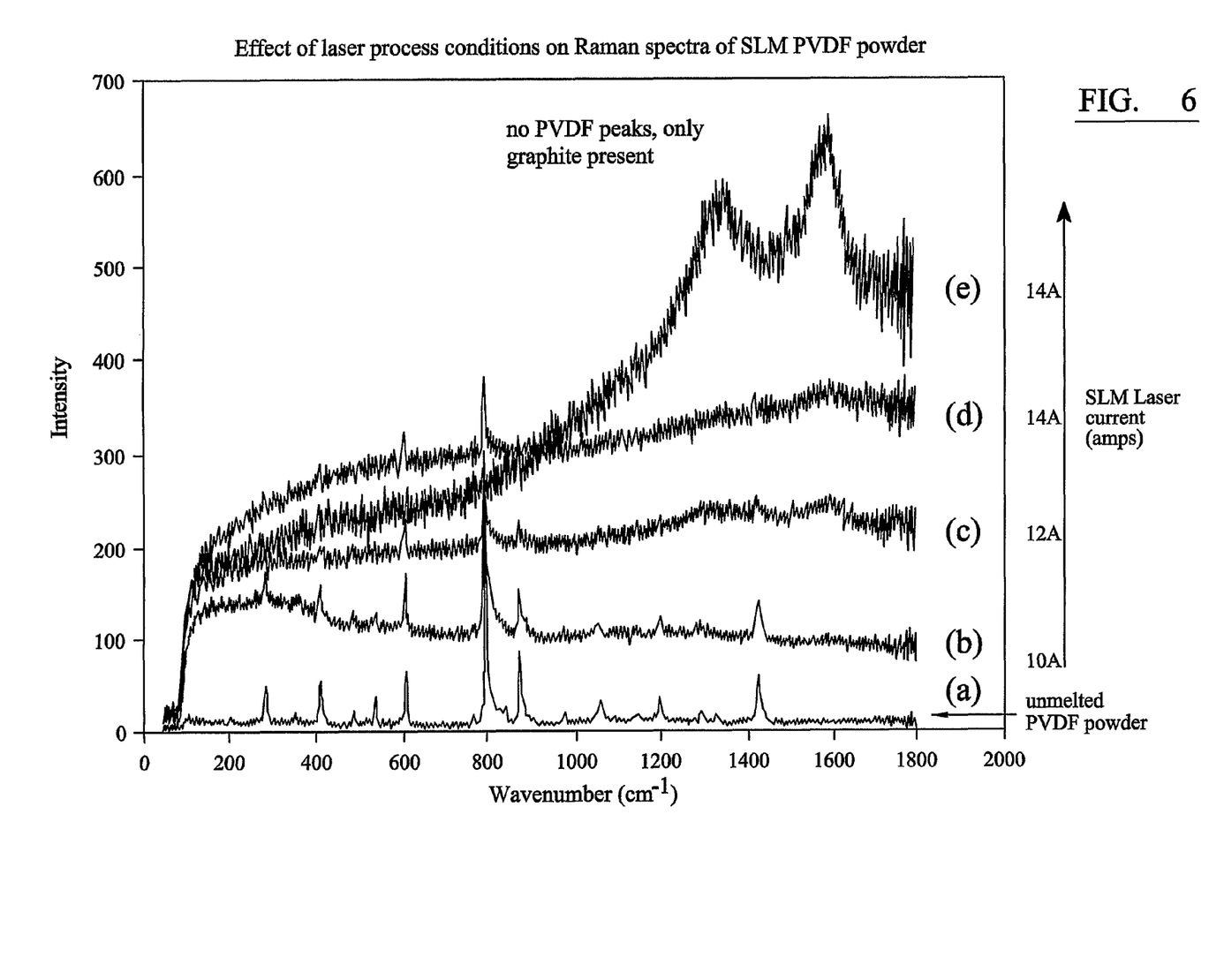
FIG. 6 is a Raman spectrograph illustrating the effect of SLM conditions on the chemical characteristics of PVDF powder subjected to an embodiment of the process of the invention.

A Raman spectroscopy study was performed at a range of SLM conditions in order to determine whether any chemical changes in the PVDF occurred during the laser melting step. The results are shown in FIG. 6. The peaks in the spectra demonstrate a graphitic presence as laser power increased, culminating in a Raman spectra (FIG. 6e) devoid of any trace PVDF peaks and with only graphite features present. FIG. 6 highlights the optimum SLM conditions (equivalent 10A laser current, defocused laser spot) for laser melting of PVDF (as indicated by the similarities between the Raman spectra of FIG. 6b and spectra obtained from un-melted PVDF powder (see FIG. 6a)).

The thickness of the active PVDF layer is a significant factor in the piezoelectric function of the micro-positioner. The thinnest active region that can be achieved in the SLM build process is dependent on the diameter of the PVDF powder grains (ie 100 µm in this experiment).

EXAMPLE 3

Figure 1B:
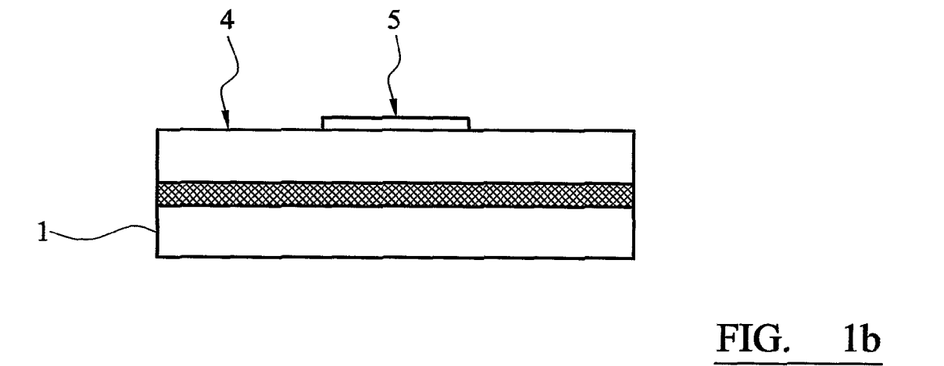
Figure 1C:
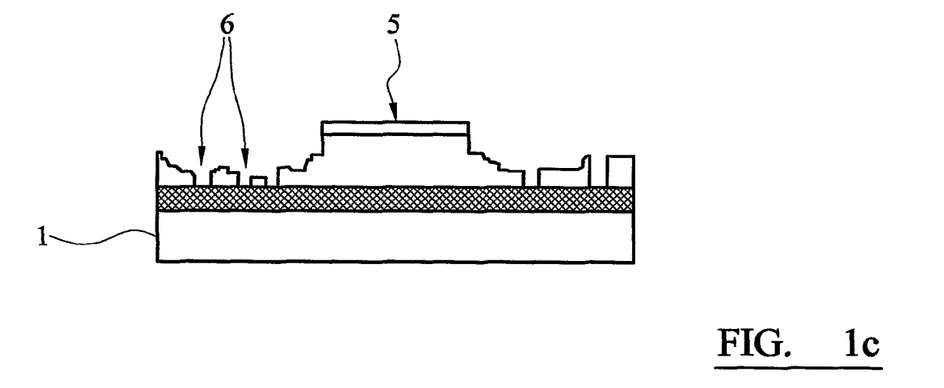
Figure 1D:
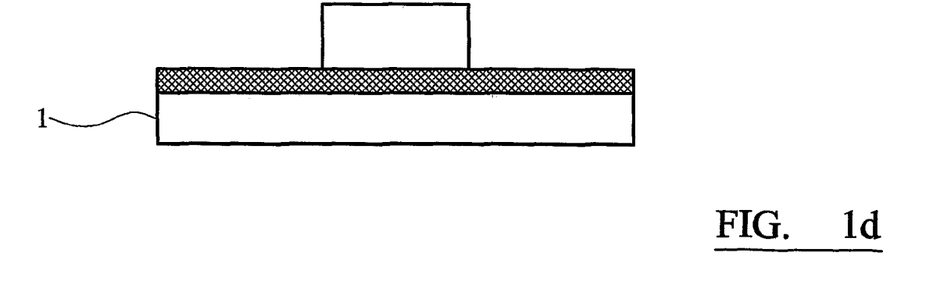
Figure 7:
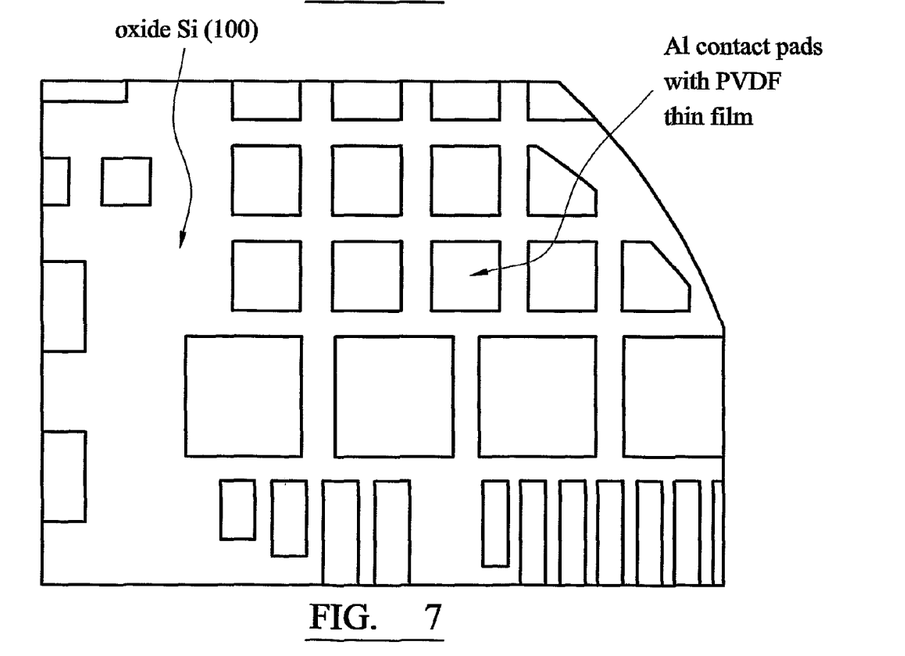
FIG. 7 illustrates a composite PVDF thin film/substrate fabricated in accordance with an embodiment of the invention.

In a further embodiment of the invention, a PVDF layer was patterned into a thin film (4) during wafer patterning. The additional steps (see FIGS. 1b-d) required to achieve this included firstly dissolving the PVDF powder in N,N-dimethylformamide (DMF) solvent (15-20% PVDF by weight). The PVDF solution was spin coated onto the patterned wafer producing a PVDF thin film (4) which was (3-5) µm thick. The PVDF covered wafer was then subjected to a second Al metallization/photoresist step (identical to the first metallization described hereinbefore) to produce an Al contact pad (5). The pattern was then transferred into the PVDF thin film by an inductively coupled plasma (ICP) $O_2$ anisotropic plasma dry etch (6) using the Al contact pad (5) as the etch mask (see FIGS. 1d and 7). The active PVDF thin film (4) is sandwiched between the Al contact layer (3) and the Al contact pad (5). Steel bodies may be fabricated onto the patterned Al contact pads (5) in accordance with the embodiment of the invention described hereinbefore.

The invention claimed is:

1. A process for fabricating a composite functional body/substrate comprising:
    localising a build of a functional material capable of being melted by a directed energy beam onto a substrate;
    selectively melting the build of functional material with the directed energy beam;
    allowing the melted functional material to form the functional body of the composite functional body/substrate; and
    applying an interfacial material to the substrate before localising the substrate with the functional material.

2. A process as claimed in claim 1 wherein the directed energy beam is selected from the group consisting of a laser beam and an E-beam.

3. A process as claimed in claim 1 wherein the composite functional body/substrate is a part or multi-layer composite.

4. A process as claimed in claim 1 wherein the composite functional body/substrate is a high aspect ratio three-dimensional composite.

5. A process as claimed in claim 1 further comprising the step of:
    metallising the substrate with a metal contact layer.

6. A process as claimed in claim 1 wherein the functional material comprises a particulate solid.

7. A process as claimed in claim 1 wherein the functional material is metal-containing.

8. A process as claimed in claim 7 wherein the metal-containing functional material is selected from a group consisting of metal alloys, zinc, titanium, aluminium oxide, lead titanate, lead zirconium titanate (PZT), lead zirconium lanthante, lead metaniobate, barium titanate, cadmium sulphide and steel.

9. A process as claimed in claim 1 wherein the functional material comprises a plurality of functional material components.

10. A process as claimed in claim 1 wherein the functional material comprises at least one functional material component capable of converting a first energy type into a second energy type.

11. A process as claimed in claim 10 wherein the functional material component is selected from the group consisting of a piezoelectric material, a shape memory material and an auxetic material.

12. A process as claimed in claim 11 wherein the piezoelectric material is selected from the group consisting of lead zirconium titanate (PZT), polyvinylidene fluoride (PVDF) and barium titanate ($BaTiO_3$).

13. A process as claimed in claim 9 wherein the functional material comprises a first functional material component and a second functional material component and wherein the first functional material component is capable of exhibiting different behaviour from the second functional material component when the functional material is exposed to the directed energy beam.

14. A process as claimed in claim 13 wherein the first functional material component is a polymer and the second functional material component is a metal.

15. A process as claimed in claim 14 further comprising:
    exposing a first part or the whole of the functional material to a directed energy beam of a first power sufficient to selectively melt the polymer but not the metal.

16. A process as claimed in claim 15 further comprising:
    exposing a second part of the functional material to a directed energy beam of a second power sufficient to volatilize the polymer.

17. A process as claimed in claim 16 further comprising:
    selectively melting some or all of the metal with a directed energy beam of a third power.

18. A process as claimed in claim 1 wherein the functional body comprises a plurality of integral discrete elements.

19. A process as claimed in claim 18 wherein the plurality of integral discrete elements differ in physical or chemical properties or physical or chemical characteristics.

20. A process as claimed in claim 19 wherein the functional body has a first discrete element which is electrically or thermally conductive and a second discrete element which is electrically or thermally insulative.

21. A process as claimed in claim 1 wherein the functional body is capable of thermal management.

22. A process as claimed in claim 21 wherein the functional body is a heat exchanger or a heat spreader.

23. A process as claimed in claim 21 wherein the substrate is an electronic substrate.

24. A process as claimed in claim 1 wherein, during the step of selectively melting the build of functional material with the directed energy beam, either the substrate and build of functional material are in motion or the directed energy beam is in motion.

25. A process as claimed claim 1 wherein the step of selective melting is carried out such that the chemical characteristics of the functional material are substantially unaltered.

26. A process as claimed in claim 1 wherein the step of selectively melting the build of functional material is carried out off-axis.

27. A process as claimed in claim 1 wherein the step of localising a build of a functional material onto a substrate comprises:
   a plurality of sequential steps of localising the build of the functional material onto the substrate.

28. A process as claimed in claim 1 wherein the step of selectively melting the build of functional material with a directed energy beam comprises:
   a plurality of sequential steps of selectively melting the build of functional material with the directed energy beam.

29. A process as claimed in claim 28 wherein the sequential steps of localising the build of the functional material onto the substrate alternate with the sequential steps of selectively melting the build of functional material with the directed energy beam.

30. A process as claimed in claim 1 wherein the step of allowing the melted functional material to form the functional body of the composite functional body/substrate comprises cooling the melted functional material.

31. A process for fabricating a composite functional body/substrate comprising:
   applying a thin film material to the substrate to generate a functional thin film and thereafter;
   localising a build of a functional material capable of being melted by a directed energy beam onto a substrate;
   selectively melting the build of functional material with the directed energy beam; and
   allowing the melted functional material to form the functional body of the composite functional body/substrate.

32. A process as claimed in claim 31 wherein the process further comprises patterning the functional thin film.

33. A composite functional body/substrate obtainable by a process as defined in claim 1.

* * * * *